US005923540A

United States Patent [19]

Asada et al.

[11] Patent Number: 5,923,540

[45] Date of Patent: Jul. 13, 1999

[54] SEMICONDUCTOR UNIT HAVING SEMICONDUCTOR DEVICE AND MULTILAYER SUBSTRATE, IN WHICH GROUNDING CONDUCTORS SURROUND CONDUCTORS USED FOR SIGNAL AND POWER

[75] Inventors: Kenji Asada; Toshio Hamano; Masaru Nukiwa, all of Kawasaki, Japan

[73] Assignee: Fujitsu Limited, Kawasaki, Japan

[21] Appl. No.: 08/873,722

[22] Filed: Jun. 12, 1997

Related U.S. Application Data

[63] Continuation of application No. 08/326,534, Oct. 20, 1994, abandoned.

[30] Foreign Application Priority Data

Nov. 30, 1993 [JP] Japan .................................... 5-300274

[51] Int. Cl.[6] ................................ H05K 9/00; H05K 1/11

[52] U.S. Cl. .......................... 361/794; 174/35 R; 174/51; 257/659; 257/728; 257/691; 257/723; 361/820; 361/764; 361/780

[58] Field of Search ................................ 174/52.4, 35 R, 174/35 TS, 51, 260, 261, 262, 265, 266; 257/659, 660, 678, 690, 691, 693, 698, 704, 723, 724, 725, 728, 774, 786; 333/247, 260; 361/748, 760, 761, 763, 764, 772, 774, 777, 778, 779, 775, 780, 783, 785, 790, 791, 792–795, 803, 816, 818, 820; 438/108, 121, 122; 439/68–72, 74, 75, 83, 92, 95, 607, 608, 894

[56] References Cited

U.S. PATENT DOCUMENTS 4,498,122 2/1985 Rainal .................................... 361/794
4,860,165 8/1989 Cassinelli ............................... 361/794
4,922,325 5/1990 Smeltz, Jr. ............................. 333/247
5,173,767 12/1992 Lange et al. ........................... 333/247
5,291,062 3/1994 Higgins, III ........................... 257/698
5,293,072 3/1994 Tsuji et al. ............................ 257/774
5,309,024 5/1994 Hirano .................................. 257/786
5,311,402 5/1994 Kobayashi et al. ..................... 361/760
5,315,069 5/1994 Gebara .................................. 361/794
5,338,570 8/1994 Boyle et al. ........................... 257/659
5,373,187 12/1994 Sugino et al. ......................... 333/247

FOREIGN PATENT DOCUMENTS 0595346 5/1994 European Pat. Off. ............... 257/659
63-272059 11/1988 Japan .
64-2399 1/1989 Japan .................................. 174/35 R
2-125650 5/1990 Japan .................................... 257/697
2-246235 10/1990 Japan .................................... 257/786
4-6104 2/1992 Japan .
4-68598 3/1992 Japan .................................... 361/794
4-372206 12/1992 Japan .................................... 333/247
5-75313 3/1993 Japan .................................... 333/247

*Primary Examiner*—Donald Sparks
*Attorney, Agent, or Firm*—Armstrong, Westerman, Hattori, Mcleland & Naughton

[57] ABSTRACT

A semiconductor device has an electrical circuit and a grounding terminal. A multilayer substrate has a plurality of insulator layers and conductor layers in a stacked arrangement and a surface with first and second regions, the conductor layers making electrical contact with the electrical circuit and the grounding terminal of the semiconductor device. The first region generally surrounds the semiconductor device and has first connecting conductors penetrating at least a part of the multilayer substrate so that each of the first conductors makes contact with one or a plurality of corresponding conductor layers. The second region generally surrounds the first region and has second connecting conductors penetrating at least a part of the multilayer substrate and only making contact with one or a plurality of conductor layers coupled to the grounding terminal of the semiconductor device.

25 Claims, 12 Drawing Sheets

50

63-2 64 63-2b 63-2a 63-2c 61-2 62-2 62-1 61-1 61-1b 63-1b 63-3c 20 27 19 61-1a 63-1a 26 63-3 63-3a 63-1 18 v 64 25 12 61-3 61-1c 63-3b 63-1c 64 24 W1 60 62-3 50a 63-4c 63-4a 63-4b 14 62-4 61-4 63-4

50
30A
32
32
32
31
31
31
60
64
64
64
64
64
16
16
16
13A
54
55
20
27
19
26
18
25
15
15
17
17
23
23
22
14
28
21
12
53
52
11
51
50

80
64
16
16
16
13B
84
60
84
84
84
54
55
20
83
85
19
82
18
81
15
15
17
17
23
23
53
52
11
14
28
51
12
50

90
60
16
16
16
64
13C
54
55
94
20
93
96
95
92
19
53
91
18
15
15
11
17
17
52
23
23
51
14
28
12
50

SEMICONDUCTOR UNIT HAVING SEMICONDUCTOR DEVICE AND MULTILAYER SUBSTRATE, IN WHICH GROUNDING CONDUCTORS SURROUND CONDUCTORS USED FOR SIGNAL AND POWER

This application is a continuation of application Ser. No. 08/326,534, filed Oct. 20, 1994, now abandoned.

BACKGROUND OF THE INVENTION

1. Field of the Invention

The present invention relates to a semiconductor unit, and particularly to a semiconductor unit containing a multilayer printed-circuit board.

As computer systems are demanded to have a high-speed processing capabilities, operation frequencies used in semiconductor units constituting the computer systems have increased, by tens MHz through hundreds MHz, for example.

Such high operation frequencies may cause the relevant semiconductor units to emit noise occurring due to inductance formed by power supply circuits included in the semiconductor units. Such noise occurs as current amounts flowing in the semiconductor units transitionally vary as a result of transistors' switching operations. Such noise, which may adversely affect operations in the relevant computer systems, should be reduced to the utmost.

Use of a multilayer printed-circuit board, such as that shown in FIG. 2 described later, in a semiconductor unit is a method to reduce such noise. In such a multilayer printed-circuit board, a grounding layer is included, the grounding layer being a continuous-plane conductor (an entire area of the layer is a grounding conductor). Increasing an area at which grounding current effectively flows in the entire area of the grounding layer reduces inductance formed by a relevant power-supply circuit. Thus, increasing of such an area of which grounding current effectively flows in the entire area of such a grounding layer is effective to reduce relevant noise.

2. Related Art

With reference to FIGS. 1, 2 and 3, a land-grid-array (LGA) type printed-circuit board package 10 in the related art will now be described. FIG. 1 shows a bottom surface of the package 10 and FIG. 2 shows a side-elevational sectional view of the package 10 taken along a line II—II shown in FIG. 1. FIG. 2 shows the package so that the bottom surface of the package is located at a top of the figure for the sake of description. The package 10 will be mounted on a substrate via a socket 30 shown in FIG. 2 so that electric circuits contained in the package 10 are connected with electric circuits formed on the substrate. The package 10 packing a semiconductor device 12 therein includes a heat spreader 11, a multilayer printed-circuit board 13 and a lid 14.

The printed-circuit board 13 includes conductor layers consisting of two continuous-plane-conductor power supply layers 15, three continuous-plane-conductor grounding layers 16, and two signal circuit pattern layers 17, as shown in FIG. 2. An insulator layer is provided in each space present between adjacent conductor layers so as to electrically insulate the conductor layers from one another. The insulator layers may be made of ceramic or the like. Power supply through holes 18, grounding through holes 19 and signal through holes 20 are formed in the printed-circuit board 13, as shown in FIG. 2. Each of the through holes 18, 19 and 20 has conductor metal plated on a wall thereof so as to form a connecting conductor for connecting conductor patterns formed on relevant layers of the layers 15, 16 and 17 as a result of the connecting conductor coming into contact with the conductor patterns, the through hole being bored substantially perpendicular to the layers. An opening 21 is formed at a middle of the package 10 as shown in FIG. 1. The signal circuit pattern layers 17 have inner conductor patterns 23 thereon at peripheries of the opening 21 as shown in FIG. 2, the inner conductor patterns 23 being exposed as inner edges of the layers form steps 22 as shown in FIG. 2. Electric circuits contained in the semiconductor device 12 are connected with the inner conductor patterns 23 via bonding wires 28.

The printed-circuit board 13 further has power supply land contacts 25, grounding land contacts 26, signal land contacts 27 on the bottom surface 24 of the printed-circuit board 13. Each contact of the above land contacts 25, 26, and 27 has a plane surface, with which a projecting end of a relevant pin 31 comes into contact, as shown in FIG. 2. As shown in FIGS. 1 and 2, each land contact of the land contacts 25, 26 and 27 is located beside an open end of a relevant through hole of the above through holes 18, 19 and 20, the lands being connected with the conductor metal, acting as the connecting conductor, provided on the walls of the through holes 18, 19 and 20, respectively, as shown in FIG. 2. These contacts 25, 26 and 27 will come into contact with the relevant pins 31 projecting from the above-mentioned socket 30 as shown in FIG. 2 so as to establish electrical contact between the substrate having the socket 30 provided thereon and the conductor patterns in the forms of the layers 15, 16 and 17 via the connecting conductors provided in the through holes 18, 19 and 20 and the contacts 25, 26 and 27. Thus, the electrical circuits contained in the semiconductor device 12 are connected with the electrical circuits contained in the substrate.

Further, as shown in FIG. 1, the pairs of the land contacts and respective through-hole open ends are staggeringly arranged on the bottom surface 24. The pairs are arranged in an area surrounding the lid 14 covering a top (in FIG. 2) of the opening 21 as shown in the figure. For the sake of clear description, indication of the pairs of the power supply and signal land contacts 25 and 27 and through holes 18 and 20 is partially omitted in FIG. 1. In FIG. 1, the hatched pairs of the land contacts and through-hole open-ends correspond to the grounding land contacts 26 and the grounding through holes 19. As shown in FIG. 1. the pairs of the grounding land contacts 26 and through holes 19 are distributed so that a density of the above pairs is approximately uniform over an entire arrangement of the pairs including the land contacts 25, 26 and 27 and the open ends of the through holes 18, 19 and 20. Relevant noise is attempted to be reduced by arranging the grounding land contacts 26 and through holes 19 in such a uniform distribution manner in the related art.

However, the arrangement of grounding land contacts and connecting conductors provided in the through holes such as that described above and shown in FIG. 1 provides an area 40 in which grounding current effectively flows as shown in FIG. 3. The above grounding-current effective flowing area 40 is a cross-hatched area in FIG. 3. As shown in FIG. 3, only a narrow area near a center of the package 10 is used for the grounding current to flow in each grounding layer 16 although each grounding layer 16 consists of a continuous-plane conductor such as that described above. Such a narrow grounding-current effective flowing area 40 may not sufficiently reduce inductance formed by power supply circuits contained in the package 10. In particular, if a semiconductor unit such as the package 10 uses high operating frequencies of tens MHz through hundreds MHz, such a narrow grounding-current effective flowing area 40 may not sufficiently reduce noise occurring due to the inductance.

SUMMARY OF THE INVENTION

An object of the present invention is to provide a semiconductor unit with a multilayer printed-circuit board having a structure enabling reduction/elimination of such noise.

In order to achieve the above object, a semiconductor unit according to the present invention comprises a multilayer substrate having a plurality of insulator layers and conductor layers in a stacked arrangement and a surface with first and second regions. The multilayer substrate is such as the multilayer printed-circuit board 13 of the package 10. The surface is such as the bottom surface of the multilayer printed-circuit board of a package such as the package 10, for example. The conductor layers makes electrical contact with an electrical circuit and a grounding terminal of a semiconductor device. The first region generally surrounds the semiconductor device and has first connecting conductors penetrating at least a part of the multilayer substrate so that each of the first conductors make contact with one or a plurality of corresponding conductor layers. The second region generally surrounds the first region and has second connecting conductors penetrating at least a part of the multilayer substrate and only making contact with one or a plurality of conductor layers coupled to the grounding terminal of the semiconductor device.

Further, a grounding pattern in a form of a film is provided on the above second surface such as a periphery 29 of an area which contains the pairs of the land contacts 25, 26 and 27 and the open ends of the through holes 18, 19 and 20 (providing the first connecting conductors). The periphery 29 of the above area has no special provision therein as shown in FIG. 1, the periphery 29 therefore being referred to as a space region 29. The above second connecting conductors comprise through holes (will be referred as additional grounding through holes) to having conductor metal plated on walls thereof so as to form the connecting conductors and extend inside of the multilayer printed-circuit board substantially perpendicular to the layers 15, 16 and 17 (acting as the conductor layers) if the present invention is assumed to be applied to the semiconductor unit in the example show in FIGS. 1 and 2. The extension of the additional grounding through holes starts from the film of the grounding pattern provided on the bottom surface 24 similar to the through holes 18, 19 and 20 in the assumption.

Further, each of the second connecting conductors has a cross sectional area smaller than a cross sectional area of each of the fist connecting conductors. Thus, a density of the second connecting conductors in the second region can be higher than a density of the first connecting conductors in the first region.

Such provision of the film of the grounding pattern and open ends of the additional grounding through holes (providing the second connecting conductors) in the space region 29 (second region) enables an increase in a total number of grounding through-holes including the grounding through holes 19 (providing the first connecting conductors) and the additional grounding through holes (providing the second connecting conductors) provided in the multilayer printed-circuit board. The total number of grounding through holes provide the corresponding number of connecting conductors there. That is, the space region 29 is effectively used. Such increasing of a total number of grounding through holes and forming additional grounding through holes in the periphery of the printed-circuit board enlarge a grounding-current effective flowing area in each grounding layer 16 having the connecting conductors provided in the additional grounding through-holes passing therethrough.

According to the present invention, such a grounding pattern is provided at a position on a semiconductor unit as described above using the example. As a result, an entire area of each grounding layer such as the grounding layers 16 can be the grounding-current effective flowing area so that grounding current can appropriately flow in the grounding layers to reduce/eliminate inductance formed by power supply circuits in a package such as the package 10. Thus, noise can be effectively reduced/eliminated, the noise occurring due to presence of the inductance in particular in the case where high operating frequencies of tens MHz through hundreds MHz are used. In particular, film-shaped grounding pattern provided on a periphery of a bottom surface of the semiconductor unit such as the bottom surface 24 of the package 10 is effective for the above purpose.

Further, such a film of the grounding pattern can be used as a contact with which relevant additionally-provided pins projecting from a socket such as the socket 30 as shown in FIG. 2 come into contact when a package such as the package 10 is mounted on a substrate having the socket thereon. Providing such a film of the grounding pattern in a form of a continuous strip extending over the space region 29 ensures electric connection between the grounding layers 16 contained in the multilayer printed-circuit board and grounding circuits contained in the substrate. This is because slight position side-shifting of the package 10 on the socket cannot adversely affect electrical connection established between the additional pins on the socket and the film of grounding pattern.

Further, such additional grounding through holes are preferably arranged on such a film of the grounding pattern so that the through holes, having the connecting conductors provided therein, are distributed in a higher density at a middle in comparison to through-hole distribution at any other parts in each side of four sides of a rectangle such as that corresponding to the space region 29. Such arrangement is effective to enlarge grounding-current effective flowing area in the entire area of each grounding layer.

Other objects and further features of the present invention will become more apparent from the following detailed description when read in conjunction with the accompanying drawings.

DESCRIPTION OF THE PREFERRED EMBODIMENTS

With reference to FIGS. 4, 5, 6, 7 and 8, an LGA-type printed-circuit-board package 50 in a first embodiment, a BGA-type printed-circuit-board package 80 in a second embodiment, a PGA-type printed-circuit-board package 90 in a third embodiment of a semiconductor unit according to the present invention will now be described.

Figure 4:
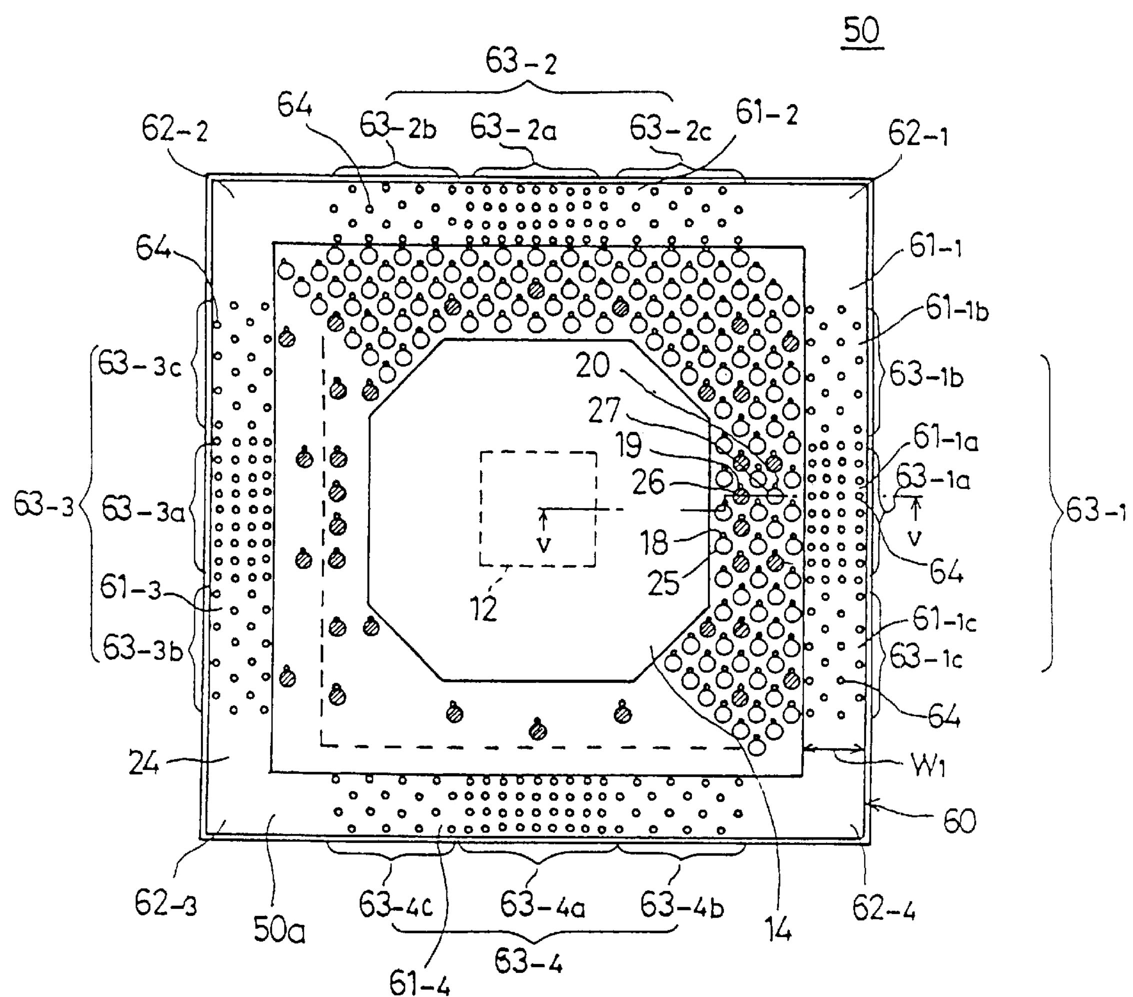
FIG. 4 shows a bottom view of a bottom surface of an LGA-type printed-circuit-board package in a first embodiment of a semiconductor unit according to the present invention.
Figure 5:
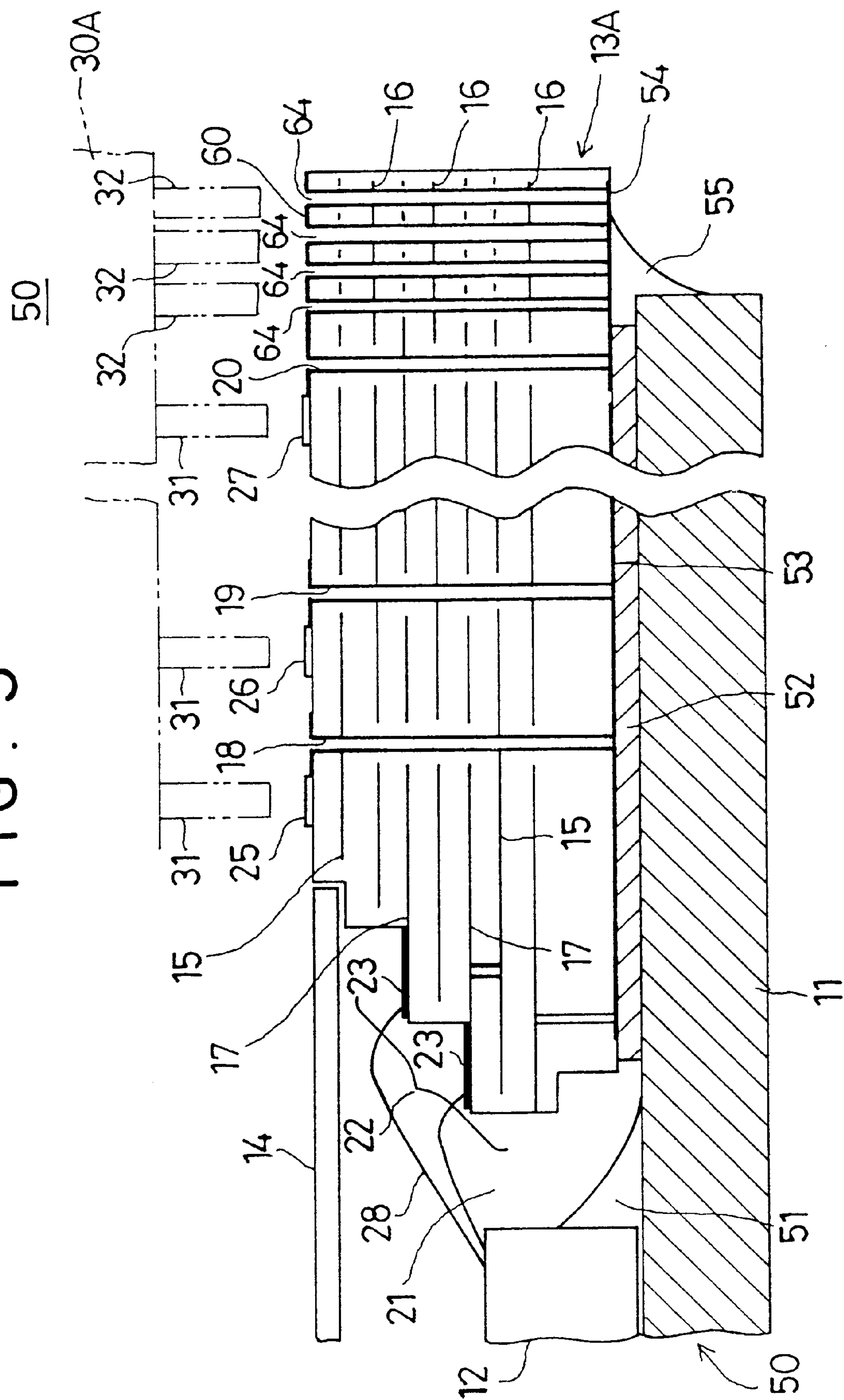
FIG. 5 shows an enlarged side-elevational sectional view taken along a line V—V shown in FIG. 4.
Figure 7:
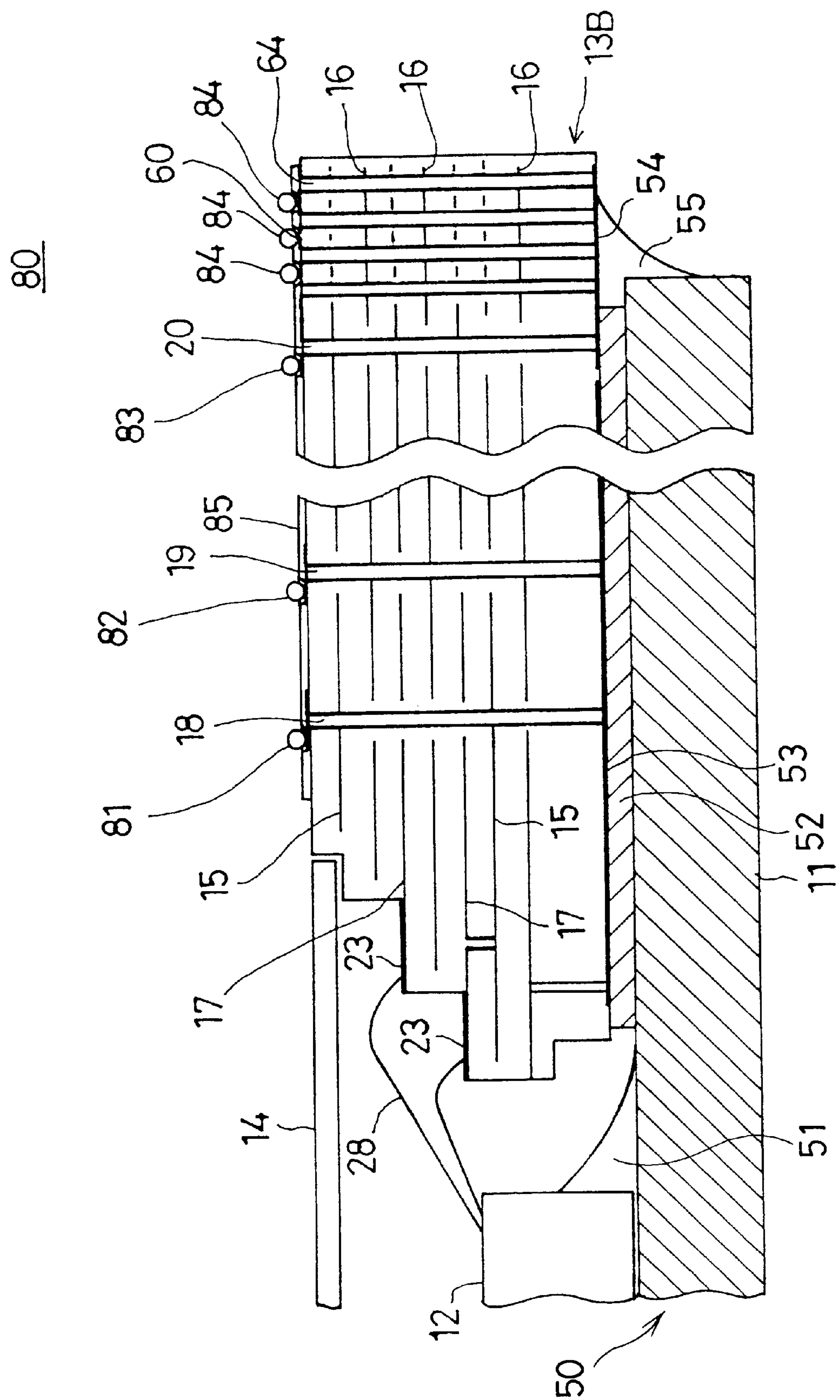
FIG. 7 shows an enlarged side-elevational sectional view taken from a ball-grid-array (BGA)-type printed-circuit-board package in a second embodiment of a semiconductor unit according to the present invention, the sectional view being a sectional view taken from the package in the second embodiment corresponding to the sectional view shown in FIG. 5 taken from the package in the first embodiment.
Figure 8:
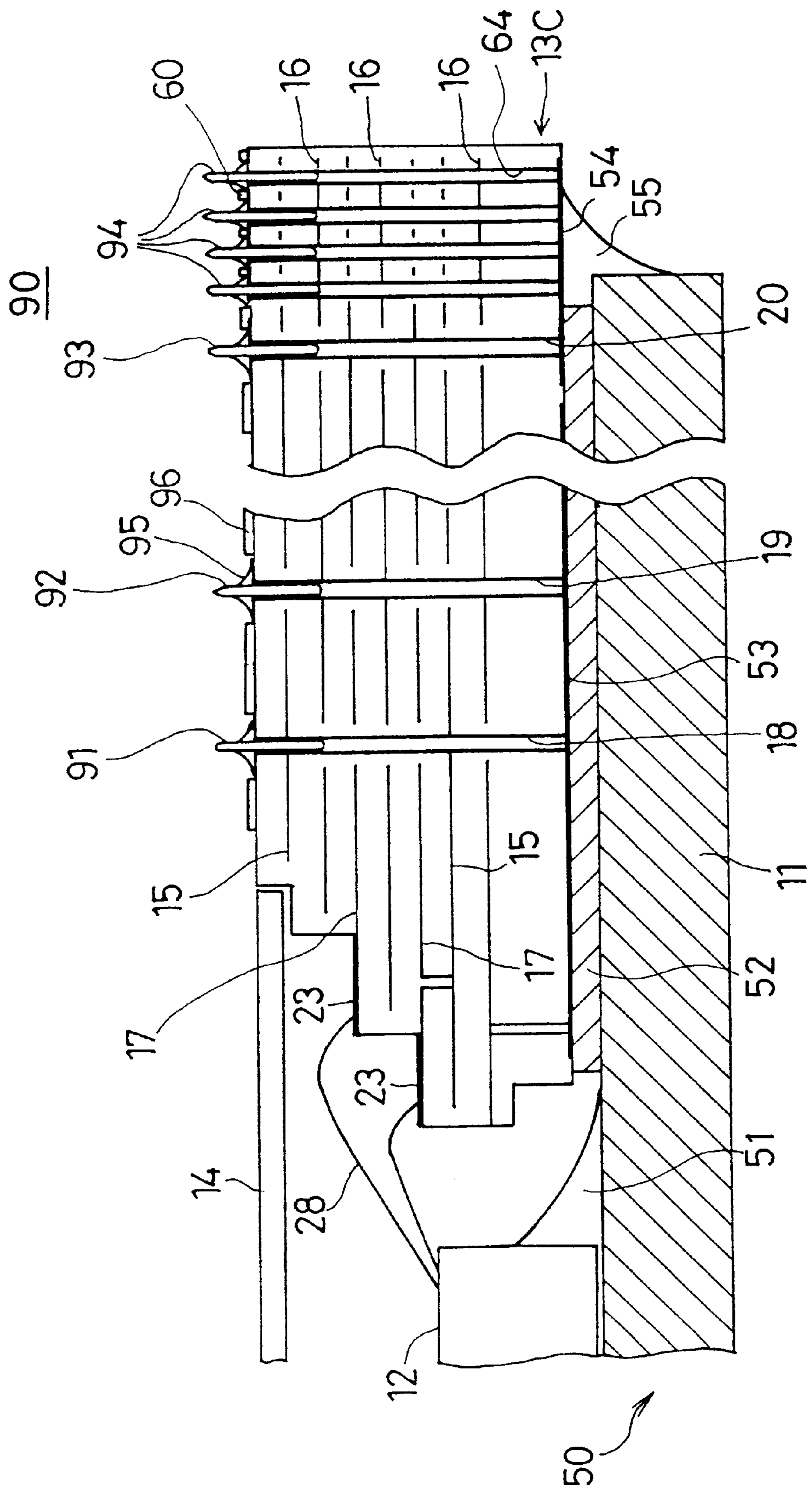
FIG. 8 shows an enlarged side-elevational sectional view taken from a pin-grid-array (PGA)-type printed-circuit-board package in a third embodiment of a semiconductor unit according to the present invention, the sectional view being a sectional view taken from the package in the third embodiment corresponding to the sectional view shown in FIG. 5 taken from the package in the first embodiment.

Each of the above three packages 50, 80 and 90 is a type of printed-circuit-board package that may be applied to computer systems substantially corresponding to computer systems to which the above-described package 10 in the related art may be applied. Especially, the package 50 shown in FIGS. 4 and 5 is an LGA-type of package same as the type of the package 10 shown in FIGS. 1 and 2. FIG. 4 shows a bottom view corresponding to the bottom view shown in FIG. 1 of the package 10. Each of FIGS. 5, 7 and 8 shows a sectional view taken corresponding to the sectional view shown in FIG. 2 taken from the package 10. The structure of each of the packages 50, 80 and 90 is similar to the structure of the above-described package 10 in the related art. Thus, for the sake of avoiding repeated description, previously made description of structures in each of the packages 50, 80 and 90 substantially identical to corresponding structures in the package 10 will be omitted. The same reference numerals have been given to elements in each of the packages 50, 80 and 90, the elements corresponding to elements in the package 10.

As shown in FIG. 7, a multilayer printed-circuit board 13B in the package 80 has ball contacts 81, 82 and 83 disposed on the bottom surface 24 adjacent to top (in FIG. 7) open ends of relevant through holes 18, 19 and 20 are used instead of the land contacts 25, 26 and 27.

As shown in FIG. 8, a multilayer printed-circuit board 13C in the package 90 has pin contacts 91, 92 and 93 inserted into relevant through holes 18, 19 and 20 through top (in FIG. 8) open ends are used instead of the land contacts 25, 26 and 27. The thus inserted pin contacts 91, 92 and 93 are fixed as they are using solder 95.

In each package of the packages 50, 80 and 90, the semiconductor device 12 is adhered on the heat spreader 11 at a middle thereof using adhesive 51. A multilayer printed-circuit board (relevant one of 13A, 13B and 13C) is fixed on the heat spreader 11 so that the semiconductor device 12 is located at the middle of the opening 21. Epoxy adhesive 52 is used to fix the multilayer printed-circuit board (relevant one of 13A, 13B and 13C) to the heat spreader 11. Each package of the packages 50, 80 and 90 is provided with a grounding line 53 and a power supply line 54 on a bottom (in FIGS. 5, 7 and 8) of the printed-circuit board (relevant one of 13A, 13B and 13C) and provided with solder 55 between the bottom of the printed-circuit board and the heat spreader 11, as shown in FIGS. 5, 7 and 8. The solder 55 electrically connects the power supply line 54 with the heat spreader 11.

With FIGS. 5, 7 and 8, the connecting conductors provided in the power supply through holes 18 seem to come into contact with the above grounding lines 53, the connecting conductors of the signal through holes 20 and grounding through holes 64 which will be described later seem to come into contact with the power supply lines 54. However, the connecting conductors of the power supply through holes 18 do not come into contact with the grounding lines 53 since the grounding lines 53 have two-dimensional patterns formed on the bottom plane (in FIGS. 5, 7 and 8) of the multilayer printed-circuit board 13A, 13B and 13C. The patterns are formed appropriately so as to prevent the power supply through holes 18 from making contact with the grounding lines 53. Similarly, neither the connecting conductors of the signal through holes 20 nor the connecting conductors of the grounding through holes 64 come into contact with the above power supply lines 54 since the power supply lines 54 also have appropriate two-dimensional patterns formed on the bottom plane (in FIGS. 5, 7 and 8) of the multilayer printed-circuit board 13A, 13B and 13C.

Signal circuits contained in the semiconductor device 12 are connected with the relevant inner conductor patterns 23 via bonding wires 28. The patterns relevant to the signal circuits are connected with the signal land contacts 27 via connecting conductors provided in relevant signal through holes 20. Power supply circuits contained in the semiconductor device 12 are connected with the relevant inner conductor patterns 23 via bonding wires 28. The patterns relevant to the power supply circuits are connected with the power supply layers 15 and with the power supply land contacts 25 via connecting conductors provided in relevant power supply through holes 18. Grounding circuits contained in the semiconductor device 12 are connected with the relevant inner conductor patterns 23 via bonding wires 28. The patterns relevant to the grounding circuits are connected with the grounding layers 16 and with the grounding layers 16 via inner walls of the multilayer printed-circuit boards 13A, 13B and 13C. The inner walls face the semiconductor devices 12 and plated with conductive metal.

As shown in FIG. 4, a grounding pattern 60 is provided on the bottom surface 14 of each of the printed-circuit boards 13A, 13B and 13C. The grounding pattern 60 is made of conductor metal. The grounding pattern 60 extends along an entire length of four sides of a square or rectangle, a shape of the bottom surface 14 so as to form a hollow square or rectangle like a picture frame. The grounding pattern 60 surround the land contacts 25, 26 and 27 if the package 50 is relevant (the ball contacts 81, 82 and 83 if the package 80 is relevant, and the pin contacts 91, 92 and 93 if the package 90 is relevant) and the through holes 18, 19 and 20.

The grounding pattern 60 consists of four side parts 61$_{-1}$, 61$_{-2}$, 61$_{-3}$, and 61$_{-4}$ and four corner parts 62$_{-1}$, 62$_{-2}$, 62$_{-3}$, and 62$_{-4}$ at the four corners of the above-mentioned square or rectangle, each side part being present between adjacent corner parts. Four groups of additional grounding through holes 63$_{-1}$, 63$_{-2}$, 63$_{-3}$, and 63$_{-4}$ are formed in each of the printed-circuit boards 13A, 13B and 13C. Each through hole of the four groups of the additional grounding through holes 63$_{-1}$, 63$_{-2}$, 63$_{-3}$, and 63$_{-4}$ is referred to as the through hole 64. Each through hole 64 extends substantially perpendicular to the layers 15, 16 and 17 and an open end of each through hole 64 is located in the side parts 61$_{-1}$, 61$_{-2}$, 61$_{-3}$, and 61$_{-4}$ of the grounding pattern 60 as shown in FIG. 4. Each through hole 64 has conductor metal plated on a wall thereof so as to form a connecting conductor for electrically connecting the grounding pattern 60 with the grounding conductors of all the grounding layers 16. The grounding pattern 60 serves as a grounding land contact for the connecting conductors provided in the groups of additional grounding through holes 64 (63$_{-1}$, 63$_{-2}$, 63$_{-3}$, and 63$_{-3}$). Further, as shown in FIG. 4, a cross sectional area of each of the above groups of additional grounding through holes 64 is smaller than a cross sectional area of each of the above power supply, grounding and signal through holes 18, 19 and 20. In a structure such as that consisting of the grounding pattern 60 and the groups of additional grounding through holes 64, a higher density of through holes can be realized, in comparison to the structure in which each through hole has a land contact thereby and has a larger cross sectional area. Therefore, a greater number of grounding through holes 64 can be formed in and below (in FIGS. 5, 7 and 8) the grounding pattern 60 although a width $W_1$ of the grounding pattern 60 is relatively narrow. As a matter of fact, dense subgroups of additional grounding through holes 63$_{-1a}$, 63$_{-2a}$, 63$_{-3a}$ and 63$_{-4a}$ which will be described later are distributed in a higher density with respect to the number of through holes present in a unit area than a density in which the through holes 18, 19 and 20 are distributed.

Figure 2:
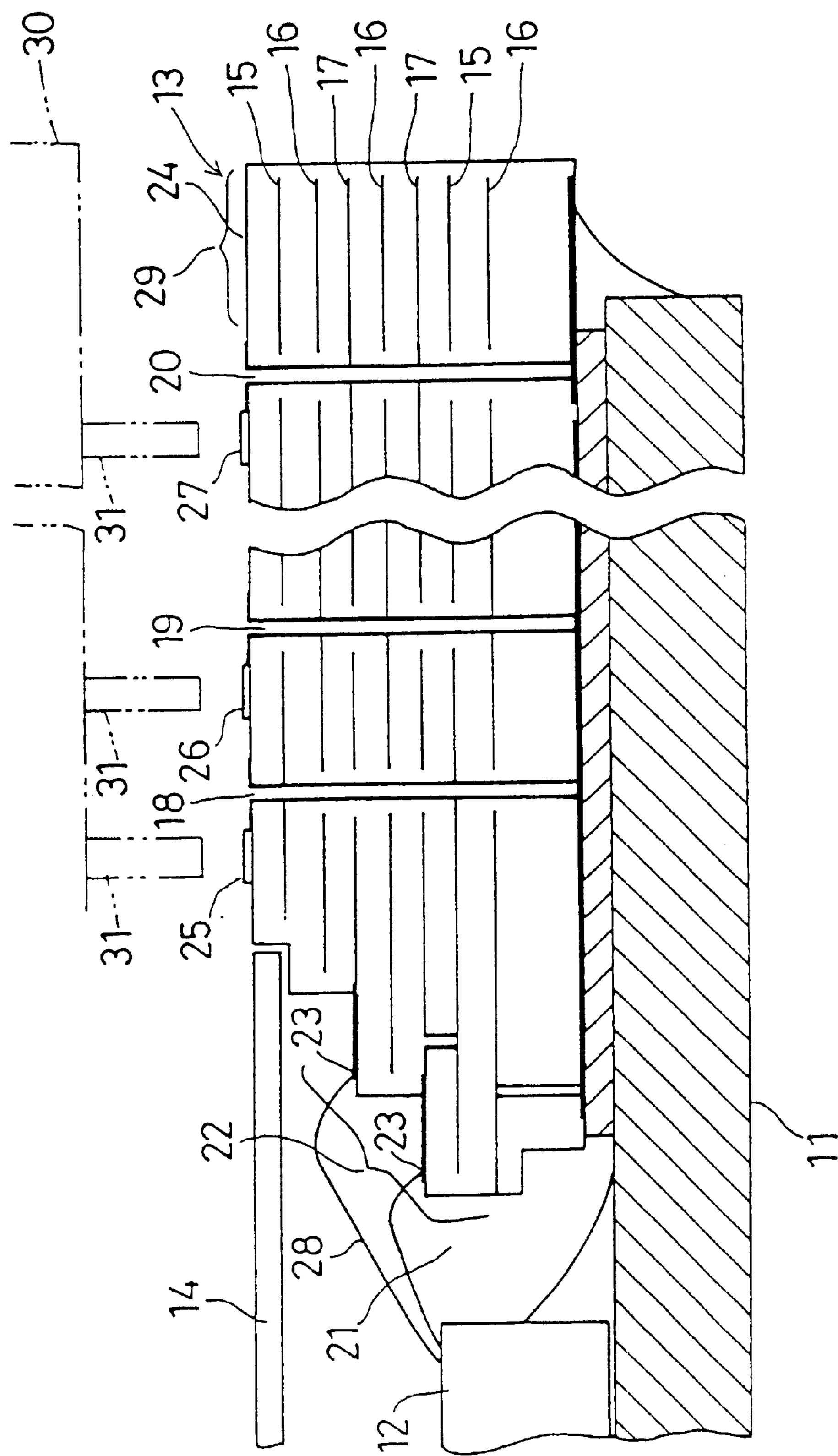
FIG. 2 shows an enlarged sectional view of the above package 10.

As shown in FIG. 5, a socket 30A for the package 50 has a plurality of pins 32 projecting therefrom to come into contact with the grounding pattern 60 in addition to the pins 31 also provided on the socket 30 shown in FIG. 2. The pins 32 are disposed at positions outside of positions at which the pins 31 are disposed and disposed so as not to meet the connecting conductors of the through holes 64 when the package 50 is mounted on the socket 30A. The package 50 will be mounted on the socket 30A so that the land contacts 25, 26 and 27 come into contact with the pins 31 and the grounding pattern 60 comes into contact with the pins 32 so that electrical circuits including grounding circuits contained in the package are appropriately connected with relevant electrical circuits provided on the substrate having the socket 30A thereon.

As shown in FIG. 7, the above-mentioned package 80 in the second embodiment further has many additional grounding ball contacts 84 disposed on the grounding pattern 60 adjacent to the grounding through holes 64. Further, a solder resist film 85 is formed on the bottom surface 24 excepting positions at which the ball contacts 81, 82, 83 and 84 are disposed. The solder resist film 85 is formed on the bottom surface 24 before the ball contacts 81, 82, 83 and 84 are disposed on the bottom surface 24. The solder resist film 85 is therefore formed in a pattern having spaces at positions at which the ball contacts 81–84 will be disposed. Then, the ball contacts 81–84 are disposed at the thus provided spaces in the pattern. The conductor metal acting as the connecting conductors provided on walls of the through holes 18, 19, 20 and 64 extend on the bottom surface 24 appropriately so that the disposed ball contacts 81–84 have electrical connection with the connecting conductors of the relevant through holes 18, 19, 20 and 64. Further, each of substrates on which the BGA-type package 80 is mounted has a socket having a structure adapted for the above-described structure of the package 80.

As shown in FIG. 8, the above-mentioned package 90 in the third embodiment further has many additional grounding pin contacts 94 inserted into the grounding through holes 64 in the grounding pattern 60 and soldered to be fixed as they are. Further, a solder resist film 96 is formed on the bottom surface 24 excepting positions from which the through holes 18, 19, 20 and 64 extend. The solder resist film 96 is formed on the bottom surface 24 before the pin contacts 91, 92, 93 and 94 are inserted in the relevant through holes. The solder resist film 96 is therefore formed in a pattern having spaces at positions from which the through holes 18, 19, 20 and 64 extend. Then, the pin contacts 91–94 are inserted through the thus provided spaces in the pattern. Then, the thus inserted pin contacts 91–94 are together soldered so as to be fixed in the relevant through holes. Each of substrates on which the PGA-type package 90 is mounted has a socket having structure adapted for above-described structure of the package 90.

Each group of the groups of additional grounding through holes 63$_{-1}$, 63$_{-2}$, 63$_{-3}$, and 63$_{-4}$ consists of the above-mentioned dense subgroup (relevant one of 63$_{-1a}$, 63$_{-2a}$, 63$_{-3a}$, and 63$_{-4a}$), a first sparse subgroup (relevant one of 63$_{-1b}$, 63$_{-2b}$, 63$_{-3b}$, and 63$_{-4b}$ and a second sparse subgroup (relevant one of 63$_{-1c}$ 63$_{-2c}$, 63$_{-3c}$, and 63$_{-4c}$), as shown in FIG. 4. Each of the dense subgroups of additional grounding through holes (relevant one of 63$_{-1a}$, 63$_{-2a}$, 63$_{-3a}$, and 63$_{-4a}$) are disposed at a middle portion (61$_{-1a}$ if the side part 61$_{-1}$ is relevant) located at a middle of a relevant side part of side parts 61$_{-1}$, 61$_{-2}$, 61$_{-3}$, and 61$_{-4}$ of the grounding pattern 60 as shown in FIG. 4. Each of the first sparse subgroups of additional grounding through holes (relevant one of 63$_{-\ 1b}$, 63$_{-2b}$, 63$_{-3b}$, and 63$_{4b}$) are disposed at a first side portion (61$_{-1b}$ if the side part 61$_{-1}$ is relevant) located at a first side of the above-mentioned middle portion (61$_{-1a}$ if the side part 61$_{-1}$ is relevant) of a relevant side part of side parts 61$_{-1}$, 61$_{-2}$, 61$_{-3}$, and 61$_{-4}$ of the grounding pattern 60 as shown in FIG. 4. Each of the second sparse subgroups of additional grounding through holes (relevant one of 63$_{-1c}$, 63$_{-2c}$, 63$_{-3c}$, and 63$_{-4c}$) are disposed at a second side portion (61$_{-1c}$ if the side part 61$_{-1}$ is relevant) located at a second side of the above-mentioned middle portion (61$_{-1a}$ if the side part 61$_{-1}$ is relevant) of a relevant side part of side parts 61$_{-1}$, 61$_{-2}$, 61$_{-3}$, and 61$_{-4}$ of the grounding pattern 60 as shown in FIG. 4.

The through holes 64 belonging to the dense subgroups of additional grounding through holes 63$_{-1a}$, 63$_{-2a}$, 63$_{-3a}$, and 63$_{-4a}$ are arranged in a form of 9-row ×4-column matrix in each subgroup, as shown in FIG. 4. The through holes 64 belonging to the first and second sparse subgroups of additional grounding through holes 63$_{-1b}$, 63$_{-2b}$, 63$_{-3b}$, 63$_{-4b}$, 63$_{-1c}$, 63$_{-2b}$, 63$_{-3c}$, and 63$_{-4c}$ are arranged in each subgroup, as shown in FIG. 4, as follows: In conjunction with the matrix of each above dense subgroup, each sparse subgroup of through holes 64 are arranged in a form such as a form resulting from removing a side row of the above matrix, and also removing one through hole alternately from each row so that 8 rows are present, each row has two through holes and further the through holes 64 are staggeringly arranged as shown in the figure. Thus, a density of each sparse subgroup is sparser than a density of each dense subgroup.

Figure 3:
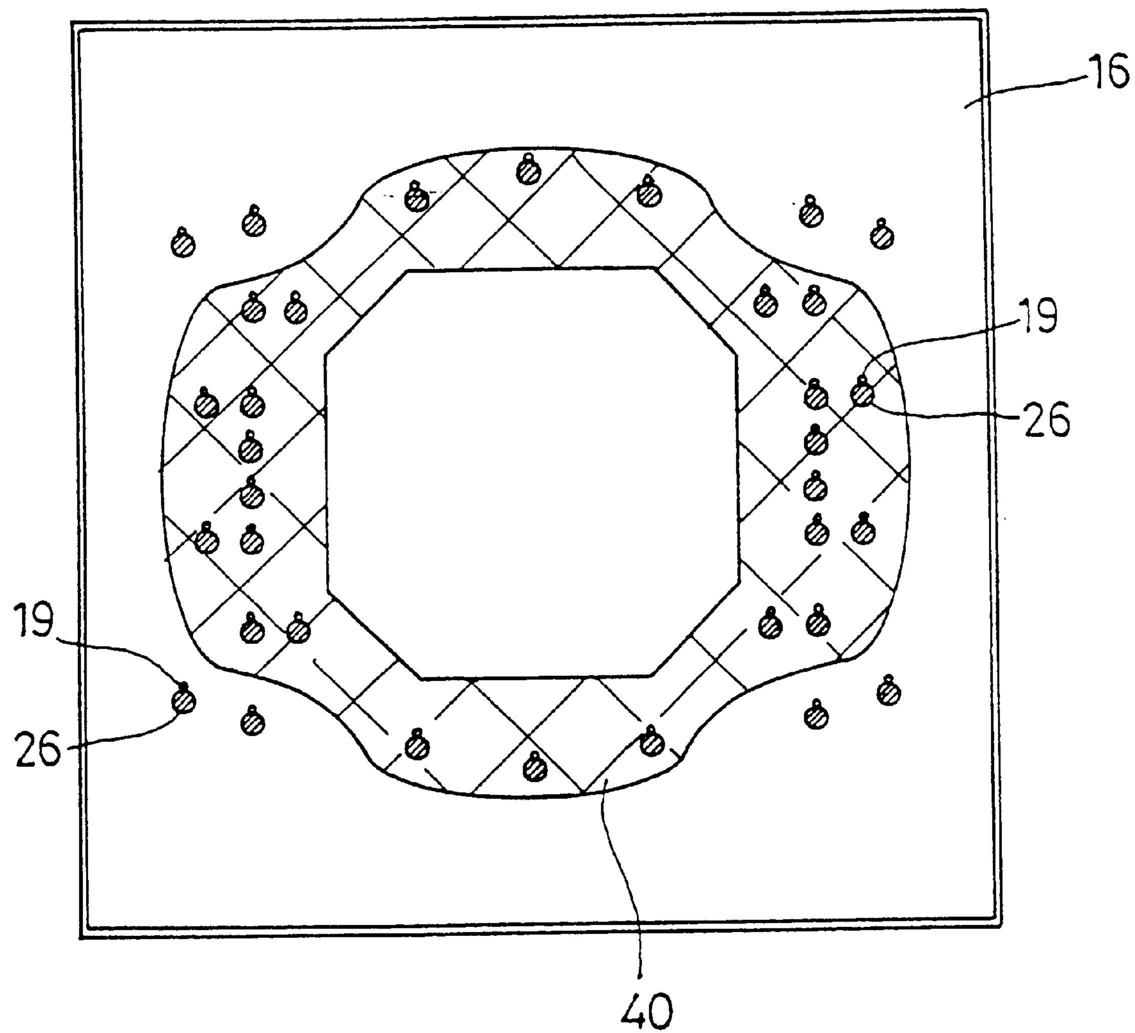
FIG. 3 shows a bottom view of a grounding layer 16 contained in the above package 10.
Figure 6:
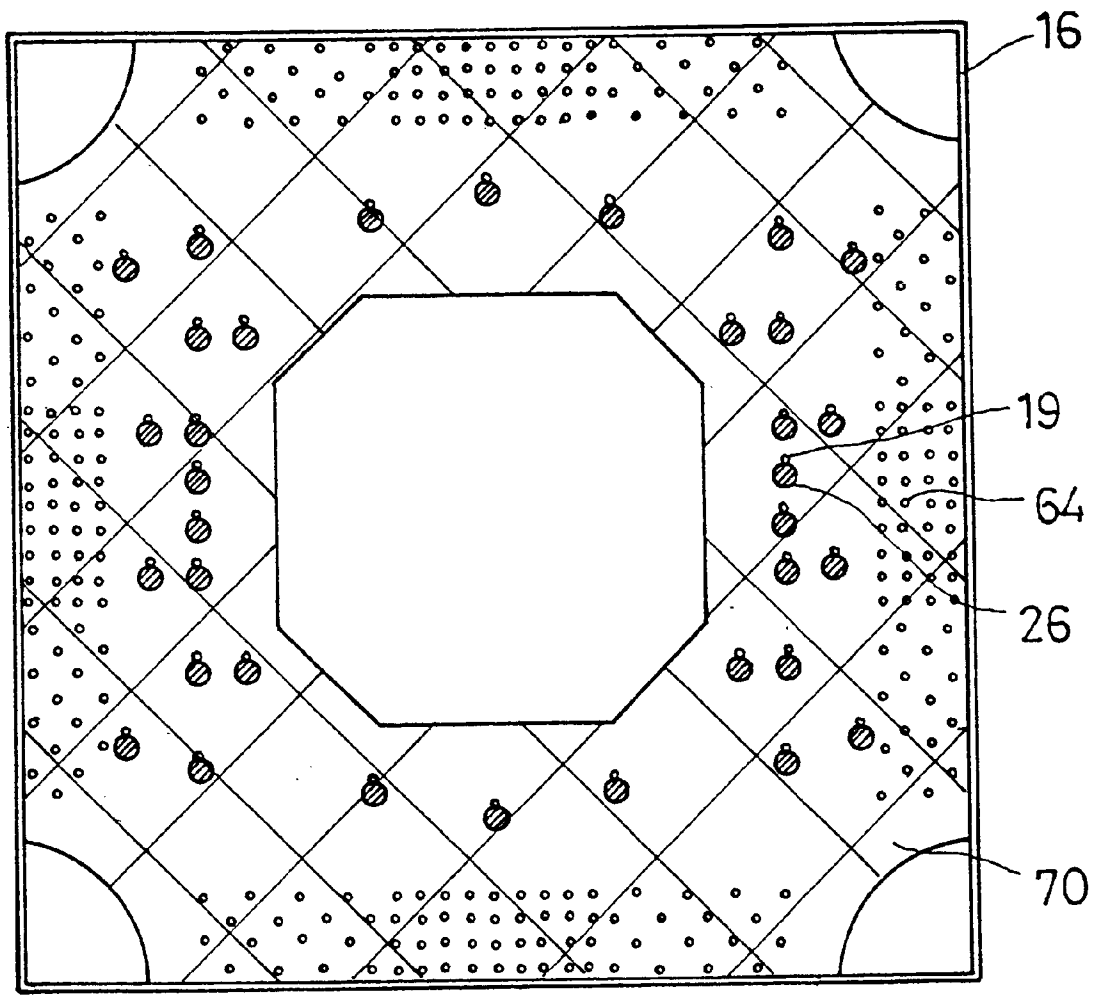
FIG. 6 shows a bottom view of a grounding layer 16 contained in the package shown in FIG. 4.

Thus, each of the packages 50, 80 and 90 in the first, second and third embodiments of a semiconductor unit according to the present invention has the groups of additional grounding through holes $63_{-1}$, $63_{-2}$, $63_{-3}$ and $63_{-4}$ in addition to the grounding through holes 19. Further, as described above, the structure in particular of the package 50 enables forming of a greater number of grounding through holes 64 in the limited space area 29 shown in FIG. 1. Further, the arrangement of the through holes 64 are such as that consisting of the above-described dense subgroups and the first and second sparse subgroups of the additional grounding through holes. That is, the middle of each of the square or rectangle's four sides has a higher density of through holes than the density of through holes at the sides of each of the square or rectangle's four sides. As a result of constructing the packages 50, 80 and 90 in the above-described structures, a grounding-current effective flowing area 70 (cross-hatched in FIG. 6) can be increased in each layer of the grounding layers 16 as shown in FIG. 6, in comparison with the condition shown in FIG. 3. Thus, as shown in FIG. 6, approximately the entire area of each of the grounding layers 16 is the grounding-current effective flowing area 70. Accordingly inductance formed by power supply circuits contained in the multilayer printed-circuit boards 13A, 13B and 13C can be reduced/eliminated, relevant noise being thus reduced/eliminated. Further, the package 50 in particular has an advantageous structure in which the continuous-plane grounding pattern 60 is provided for the relevant pins 32 to come into contact therewith as shown in FIG. 5. Thus, electric connection between the grounding layers 16 contained in the printed-circuit substrate 13A and the grounding circuits contained in the substrate can be ensured. This is because slight position side-shifting of the package 50 on the socket cannot adversely affect electrical connection established between the additional pins 32 on the socket 30 and the grounding pattern 60.

The connecting conductors for connecting the power supply, grounding and signal circuit layers 15, 16 and 17 with the power supply, grounding and signal contacts 25, 26 and 27; 81, 82 and 83; 91, 92 and 93; and grounding pattern 60 are provided in the power supply, grounding and signal through holes 18, 19 and 20, and additional grounding through holes 64 in the embodiments shown in FIGS. 5, 7 and 8, as described above. However, the above through holes 18, 19, 20 and 64 for providing the connecting conductors therein can be replaced by blind holes.

Figure 9A:
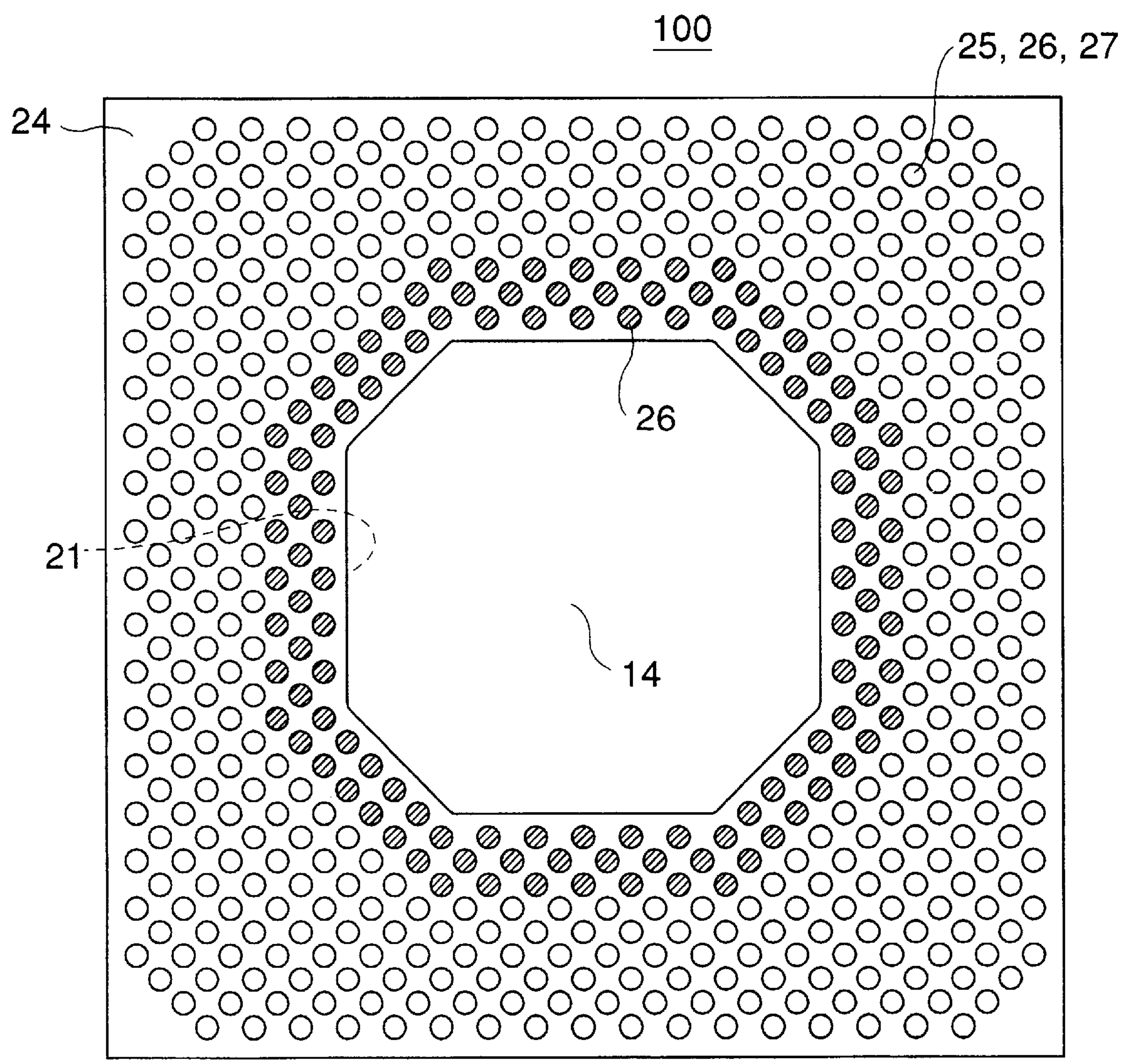
FIG. 9A shows a bottom view of the bottom surface 24 of the package 100 as an example of the related art.
Figure 9B:
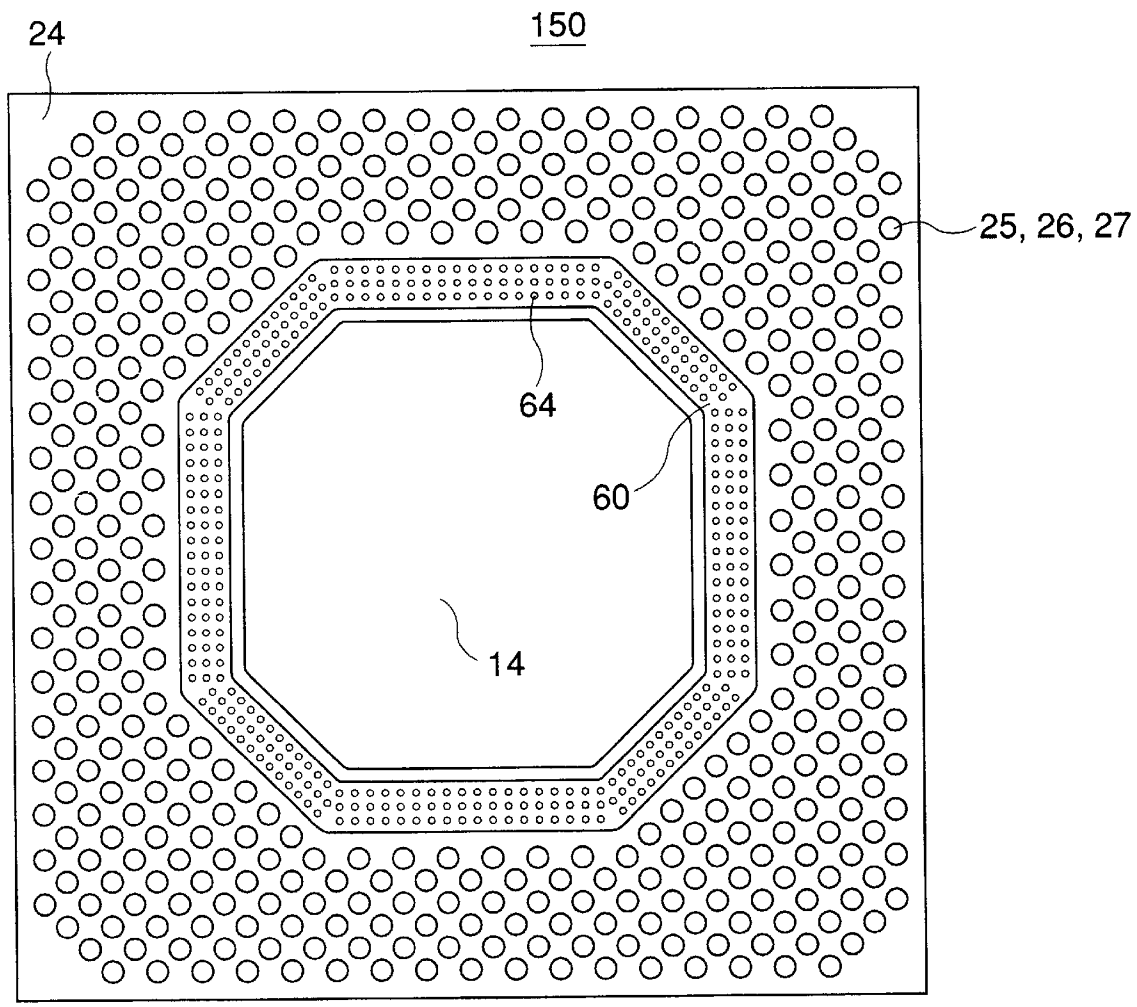
FIG. 9B shows a bottom view of a bottom surface of an LGA-type printed-circuit-board package in a fourth embodiment of a semiconductor unit according to the present invention.

With reference to FIGS. 9A and 9B, an LGA-type printed-circuit-board package 150 in a fourth embodiment of a semiconductor unit according to the present invention will now be described. The printed-circuit-board package 150 has a construction similar to that of the printed-circuit-board package 50 shown in FIG. 4. Thus, for the sake of avoiding repeated description, previously made descriptions of structures in the package 150 substantially identical to corresponding structures in the package 50 will be omitted. The same reference numerals have been given to elements in the package 150, the elements corresponding to elements in the package 50. In general, differences between the package 50 and the package 150 are allocation of the small grounding through holes 64 (with conductor metal plated on the wall thereof) and the grounding pattern in the mixed land-contact disposed area. The above-mentioned mixed land-contact disposed area is an area in which the power supply land contacts 25, grounding land contacts 26, and signal land contacts 27 (each contact being accompanied by the through hole with conductor metal plated on the wall thereof) are disposed in a manner similar to the manner in which the land contacts 25, 26 and 27 are disposed in close formation on an inner part of the bottom surface 24 shown in FIG. 1.

Figure 1:
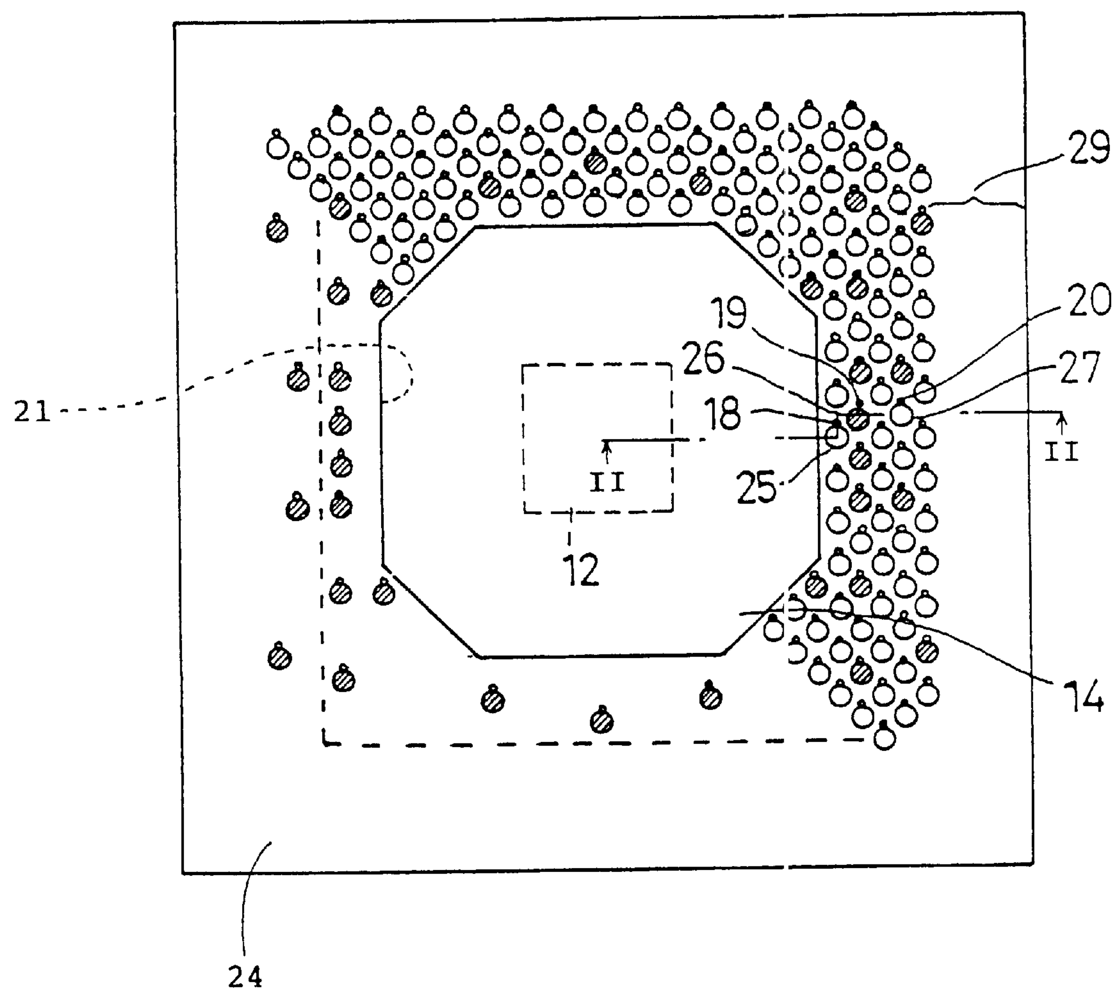
FIG. 1 shows a bottom view of the bottom surface 24 of the package 10 described above as an example of the related art.

As shown in FIG. 9A, different from the arrangement shown in FIG. 1, an LGA-type printed-circuit board package 100 in the related art has a grounding-land-contact concentratedly disposed area on the bottom surface 24. The above grounding-land-contact concentratedly disposed area is located inside the above-described mixed land-contact disposed area. Further, in the above grounding-land-contact concentratedly disposed area, the grounding land contacts 26, accompanied by the through holes 19 with conductor metal plated on the walls thereof, are disposed concentratedly. Corresponding to such an arrangement as that of the printed-circuit board package 100 in the related art, the printed-circuit board package 150 in the fourth embodiment of the present invention shown in FIG. 9B may be used. In the arrangement of the fourth embodiment shown in FIG. 9B, different from that shown in FIG. 4, a grounding pattern 60 accompanied by the small grounding through holes 64 is disposed inside the mixed land-contact disposed area. Thus, the above-mentioned above grounding-land-contact concentratedly disposed area in the arrangement shown in FIG. 9A, is replaced an area occupied by the grounding patterns 60 together with the small grounding through holes 64 in the arrangement shown in FIG. 9B. The grounding pattern 60 extends so as to form an approximately regular octagon as shown in FIG. 9B and the grounding through holes 64 are approximately evenly distributed in the pattern 60. However, density of the holes 64 is low in each vertex of the octagon as shown in the figure.

Figure 10A:
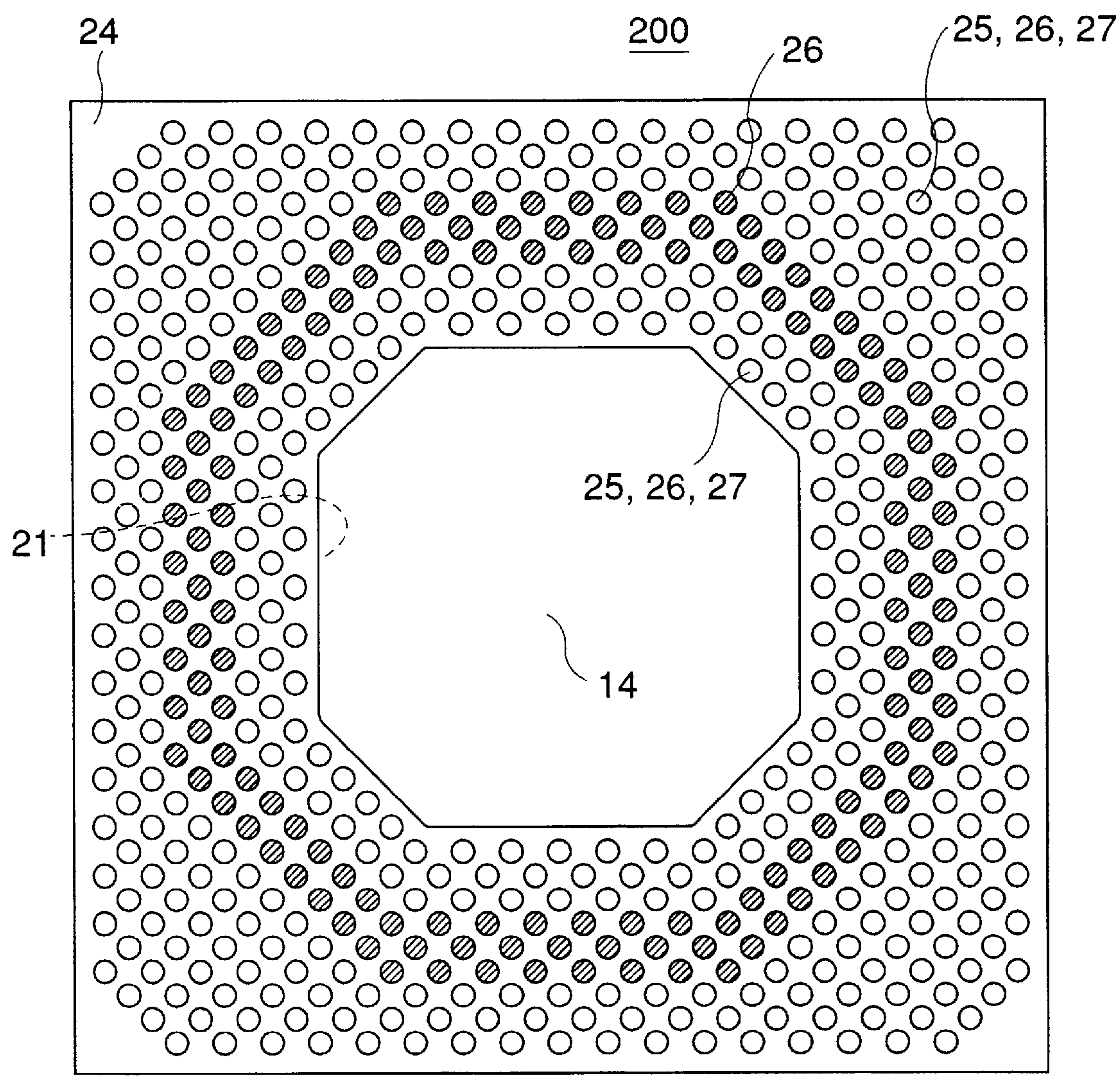
FIG. 10A shows a bottom view of the bottom surface 24 of the package 200 as an example of the related art.
Figure 10B:
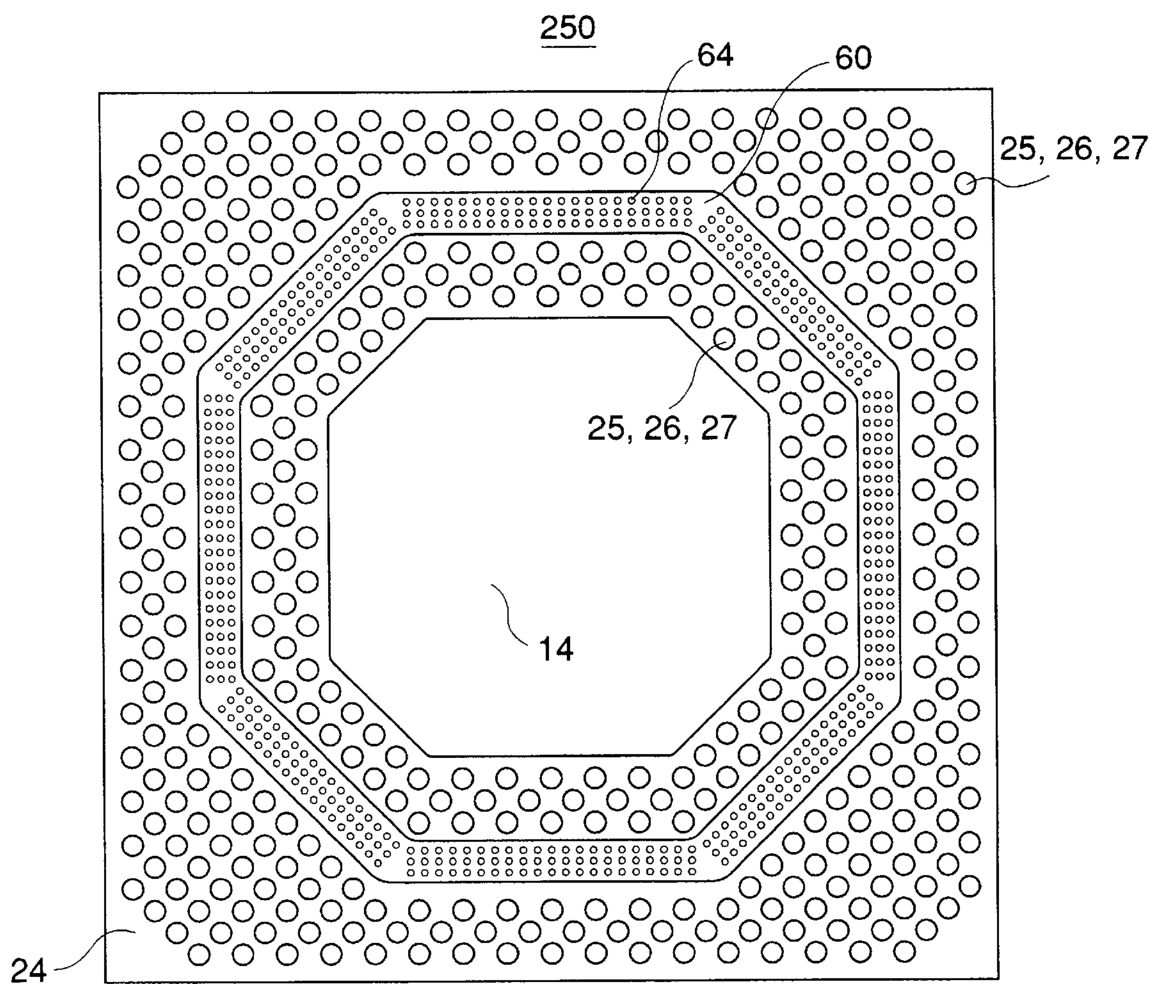
FIG. 10B shows a bottom view of a bottom surface of an LGA-type printed-circuit-board package in a fifth embodiment of a semiconductor unit according to the present invention.

With reference to FIGS. 10A and 10B, an LGA-type printed-circuit-board package 250 in a fifth embodiment of a semiconductor unit according to the present invention will now be described. The printed-circuit-board package 250 has a construction similar to that of the printed-circuit-board package 50 shown in FIG. 4. Thus, for the sake of avoiding repeated description, previously made description of structures in the package 250 substantially identical to corresponding structures in the package 50 will be omitted. The same reference numerals have been given to elements in the package 250, the elements corresponding to elements in the package 50. In general, differences between the package 50 and the package 250 are allocation of the small grounding through holes 64 (with conductor metal plated on the walls thereof) and the grounding pattern in the above-described mixed land-contact disposed area.

As shown in FIG. 10A, different from the arrangement shown in FIG. 1, an LGA-type printed-circuit board package 200 in the related art has the above-described grounding-land-contact concentratedly disposed area on the bottom surface 24. In the arrangement of the fifth embodiment, the grounding-land-contact concentratedly disposed area is located intermediate region located between an outer region and an inner region of the above-mentioned mixed land-contact disposed area. Corresponding to such an arrangement as that of the printed-circuit board package 200 in the related art, the printed-circuit board package 250 in the fifth embodiment of the present invention shown in FIG. 10B may be used. In the arrangement shown in FIG. 10B, different from that shown in FIG. 4, the grounding pattern 60 together with the small grounding through holes 64 is disposed in the above-described intermediate region of the above-described the mixed land-contact disposed area. Thus, the above-mentioned grounding-land-contact concentratedly disposed area in the arrangement shown in FIG. 10A, is replaced an area occupied by the grounding patterns 60 together with the small grounding through holes 64, in the arrangement shown in FIG. 10B. The grounding pattern 60 extends so as to form an approximately regular octagon as shown in FIG. 10B and the grounding through holes 64 are approximately evenly distributed in the pattern 60. However, density of the holes 64 is low in each vertex of the octagon as shown in the figure.

Further, the present invention is not limited to the above-described embodiments, and variations and modifications may be made without departing from the scope of the present invention.

What is claimed is:

1. A semiconductor unit comprising:

a semiconductor device disposed on an underlying layer having an electrical circuit and a grounding terminal; and a multilayer substrate disposed on the underlying layer, said multilayer substrate having a plurality of insulator layers and conductor layers in a stacked arrangement and a surface with first and second regions, said conductor layers making electrical contact with the electrical circuit and the grounding terminal of said semiconductor device, said surface generally surrounding said semiconductor device, said first region having first connecting conductors penetrating at least a part of said multilayer substrate so that each of said first connecting conductors makes contact with one or a plurality of corresponding conductor layers, said second region having:

a plane-shaped conductor formed thereon, extending along said second region; and second connecting conductors, making electrical contact with said plane-shaped conductor and penetrating at least a part of said multilayer substrate and making contact with only one or a plurality of conductor layers coupled to the grounding terminal of said semiconductor device, said plane-shaped conductor having a width corresponding to at least three rows of said second connecting conductors, wherein said semiconductor unit is a piece of a package.

2. The semiconductor unit according to claim 1, wherein said plane-shaped conductor extends along said second region so as to form four sides of a rectangle.

3. The semiconductor unit according to claim 1, wherein:

said first connecting conductors comprise signal circuit contacts, power supply contacts, and grounding contacts provided on said first region;

said conductive layers comprise a signal circuit layer, power supply layer and a grounding layer;

said first connecting conductors further comprise signal circuit conductors, power supply conductors and first grounding conductors for connecting said signal circuit contacts, power supply contacts, and grounding contacts with conductors provided in the forms of said signal circuit layer, said power supply layer and said grounding layer, respectively.

4. The semiconductor unit according to claim 3, wherein said signal circuit conductors, said power supply conductors, said first grounding conductors and said second connecting conductors comprise conductive material provided on wall of holes formed in at least a part of said multilayer substrate.

5. The semiconductor unit according to claim 4, wherein each contact of said signal circuit contacts, power supply contacts, and grounding contacts is pin-shaped, inserted into said holes, and projecting from said surface of said substrate.

6. The semiconductor unit according to claim 3, wherein each contact of said signal circuit contacts, power supply contacts, and grounding contacts is land-shaped.

7. The semiconductor unit according to claim 3, wherein each contact of said signal circuit contacts, power supply contacts, and grounding contacts is ball-shaped.

8. The semiconductor unit according to claim 1, wherein said first and second connecting conductors comprise conductive material provided on walls of holes formed in at least a part of said multilayer substrate.

9. The semiconductor unit according to claim 1, wherein said plane-shaped conductor extends along said second region so as to form four sides of a square.

10. The semiconductor unit according to claim 1, wherein:

said first region generally surrounds said semiconductor device; and said second region generally surrounds said first region.

11. The semiconductor unit comprising:

a semiconductor device disposed on an underlying layer having an electrical circuit and a grounding terminal; and a multilayer substrate disposed on the underlying layer, said multilayer substrate having a plurality of insulator layers and conductor layers in a stacked arrangement and a surface with first and second regions, said conductor layers making electrical contact with the electrical circuit and the grounding terminal of said semiconductor device, said surface generally surrounding said semiconductor device, said first region having first connecting conductors penetrating at least a part of said multilayer substrate so that each of said first connecting conductors makes contact with one or a plurality of corresponding conductor layers, said second region having:

a plane-shaped conductor formed thereon, extending along said second region; and second connecting conductors, making electrical contact with said plane-shaped conductor and penetrating at least a part of said multilayer substrate and making contact with only one or a plurality of conductor layers coupled to the grounding terminal of said semiconductor device, wherein said plane-shaped conductor extends alone said second region so as to form four sides of a rectangle, and wherein the arrangement of said second connecting conductors in said four sides of said rectangle is such that said second connecting conductors are distributed in a higher density at a middle in comparison to grounding conductor distribution at any other parts in each side of said four sides of said rectangle.

12. The semiconductor unit comprising:

a semiconductor device disposed on an underlying layer having an electrical circuit and a grounding terminal; and a multilayer substrate disposed on the underlying layer, said multilayer substrate having a plurality of insulator layers and conductor layers in a stacked arrangement and a surface with first and second regions, said conductor layers making electrical contact with the electrical circuit and the grounding terminal of said semiconductor device, said surface generally surrounding said semiconductor device, said first region having first connecting conductors penetrating at least a part of said multilayer substrate so that each of said first connecting conductors makes contact with one or a plurality of corresponding conductor layers, said second region having:

a plane-shaped conductor formed thereon, extending along said second region: and second connecting conductors, making electrical contact with said plane-shaped conductor and penetrating at least a part of said multilayer substrate and making contact with only one or a plurality of conductor layers coupled to the grounding terminal of said semiconductor device, wherein a cross-sectional area of each of said second connecting conductors is smaller than a cross-sectional area of each of said first connecting conductors.

13. The semiconductor unit according to claim 12, wherein said second region includes a part having a density of the number of said second connecting conductors provided in a unit area higher than a density of the number of said first connecting conductors provided in the unit area of said first region.

14. A semiconductor unit comprising:

a semiconductor device, disposed on an underlying layer, having an electrical circuit and a grounding terminal; and a multilayer substrate disposed on the underlying layer, said multilayer substrate having a plurality of insulator layers and conductor layers in a stacked arrangement and a surface with first and second regions, said conductor layers making electrical contact with the electrical circuit and the grounding terminal of said semiconductor device, said first region generally surrounding said semiconductor device and having first connecting conductors penetrating at least a part of said multilayer substrate so that each of said first conductors makes contact with one or a plurality of corresponding conductor layers, said second region generally surrounded by said first region and having second connecting conductors penetrating at least a part of said multilayer substrate and only making contact with one or a plurality of conductor layers coupled to the grounding terminal of said semiconductor device, said second region having a width corresponding to at least three rows of said second connecting conductors, wherein said semiconductor unit is a piece of a package.

15. A semiconductor unit, comprising:

a semiconductor device disposed on an underlying layer; and a multilayer substrate, disposed on the underlying layer and surrounding said semiconductor device, having insulator layers and conductor layers alternately layered, said semiconductor device electrically connected to one of said conductor layers, and a surface including:

through holes extending from said surface through said multilayer substrate and electrically connected to at least one of said conductor layers;

electrical contacts, each of said electrical contacts electrically connected to each of said through holes;

a first region surrounding said semiconductor device wherein said through holes and electrical contacts are disposed; and a second region surrounding said semiconductor device, having only grounding through holes of said through holes, extending from said surface through said multilayer substrate and electrically connected to a grounding layer of said conductor layers, said second region including first and second subgroups of said grounding through holes, said first subgroup having a more dense amount of said grounding through holes than said second subgroup.

16. A semiconductor unit according to claim 15, wherein said second region of said surface of said multilayer substrate surrounds said first region.

17. A semiconductor unit according to claim 15, wherein said second region of said surface of said multilayer substrate has a square shape framing said semiconductor device disposed in a center of said semiconductor unit, wherein said first subgroup of said grounding through holes is disposed in a center of each side of said square shape, and wherein said second subgroup of said grounding through holes is disposed on both sides of said first subgroup on each side of said square shape.

18. A semiconductor unit according to claim 15, wherein said second region of said surface of said multilayer substrate has a conductor metal surface.

19. A semiconductor unit, comprising:

a semiconductor device disposed on an underlying layer; and a multilayer substrate, disposed on the underlying layer and surrounding said semiconductor device, having:

a power supply layer;

a signal circuit layer electrically connected to said semiconductor device;

a grounding layer;

insulating layers layered between each of said power supply layer, said signal circuit layer, and said grounding layer; and a surface including:

power supply through holes extending from said surface through said multilayer substrate and electrically connected to said power supply layer;

power supply contacts electrically connected to said power supply through holes;

signal through holes extending from said surface through said multilayer substrate and electrically connected to said signal circuit layer;

signal circuit contacts electrically connected to said signal through holes;

grounding through holes extending from said surface through said multilayer substrate and electrically connected to said grounding layer;

grounding contacts electrically connected to said grounding through holes;

a first region surrounding said semiconductor device wherein said through holes and contacts are disposed; and a second region surrounding said semiconductor device, having only additional grounding through holes to expand a grounding current effective flowing area in said grounding layer, said second region having a width corresponding to at least three rows of said additional grounding through holes, wherein said semiconductor unit is a piece of a package.

20. A semiconductor unit according to claim 19, wherein said second region of said surface of said multilayer substrate surrounds said first region.

21. A semiconductor unit according to claim 19, wherein said second region of said surface of said multilayer substrate has a conductor metal surface.

22. A semiconductor unit according to claim 19, wherein said first region of said surface of said multilayer substrate surrounds said second region.

23. A semiconductor unit according to claim 19, wherein said second region of said surface of said multilayer substrate is disposed within said first region.

24. A semiconductor unit comprising:

a semiconductor device disposed on an underlying layer; and a multilayer substrate, disposed on the underlying layer and surrounding said semiconductor device, having:

a power supply layer;

a signal circuit layer electrically connected to said semiconductor device;

a grounding layer;

insulating layers layered between each of said power supply layer, said signal circuit layer, and said grounding layer; and a surface including:

power supply through holes extending from said surface through said multilayer substrate and electrically connected to said power supply layer;

power supply contacts electrically connected to said power supply through holes;

signal through holes extending from said surface through said multilayer substrate and electrically connected to said signal circuit layer;

signal circuit contacts electrically connected to said signal through holes;

grounding through holes extending from said surface through said multilayer substrate and electrically connected to said grounding layer;

grounding contacts electrically connected to said grounding through holes;

a first region surrounding said semiconductor device wherein said through holes and contacts are disposed; and a second region surrounding said semiconductor device, having only additional grounding through holes to expand a grounding current effective flowing area in said grounding layer, wherein said second region includes first and second subgroups of said grounding through holes, said first subgroup having a more dense amount of said grounding through holes than said second subgroup.

25. A semiconductor unit comprising:

a semiconductor device disposed on an underlying layer; and a multilayer substrate, disposed on the underlying layer and surrounding said semiconductor device, having:

a power supply layer;

a signal circuit layer electrically connected to said semiconductor device;

a grounding layer;

insulating layers layered between each of said power supply layer, said signal circuit layer, and said grounding layer; and a surface including:

power supply through holes extending from said surface through said multilayer substrate and electrically connected to said power supply layer;

power supply contacts electrically connected to said power supply through holes;

signal through holes extending from said surface through said multilayer substrate and electrically connected to said signal circuit layer;

signal circuit contacts electrically connected to said signal through holes;

grounding through holes extending from said surface through said multilayer substrate and electrically connected to said grounding layer;

grounding contacts electrically connected to said grounding through holes;

a first region surrounding said semiconductor device wherein said through holes and contacts are disposed; and a second region surrounding said semiconductor device, having only additional grounding through holes to expand a grounding current effective flowing area in said grounding layer, wherein said second region of said surface of said multilayer substrate has a square shape framing said semiconductor device in a center of said second region, said second region including:

a first subgroup of said grounding through holes disposed in a center of each side of said square shape; and a second subgroup of said grounding through holes disposed on both sides of said first subgroup on each side of said square shape, said first subgroup having a more dense amount of said grounding through holes than said second subgroup on each side of said square shape.

* * * * *